United States Patent [19]

Yamamoto et al.

[11] Patent Number: 4,999,331
[45] Date of Patent: Mar. 12, 1991

[54] PHOTO AND PRESSURE SENSITIVE RECORDING MEDIUM

[75] Inventors: Takemi Yamamoto; Shunichi Higashiyama, both of Nagoya, Japan

[73] Assignee: Brother Kogyo Kabushiki Kaisha, Aichi, Japan

[21] Appl. No.: 308,404

[22] Filed: Feb. 8, 1989

[30] Foreign Application Priority Data

Feb. 12, 1988 [JP] Japan .................................. 63-31454
Apr. 5, 1988 [JP] Japan .................................. 63-83271

[51] Int. Cl.⁵ .............................................. B41M 5/22
[52] U.S. Cl. .................................. 503/200; 427/150; 427/152; 430/138; 503/226
[58] Field of Search ................................ 427/150–152; 430/138; 503/200, 226

[56] References Cited

U.S. PATENT DOCUMENTS 4,576,831 3/1986 Hosoi et al. .......................... 503/200

FOREIGN PATENT DOCUMENTS 0013594 1/1985 Japan .................................. 503/200

Primary Examiner—Bruce H. Hess
Attorney, Agent, or Firm—Kane, Dalsimer, Sullivan, Kurucz, Levy, Eisele and Richard

[57] ABSTRACT

In a photo and pressure sensitive recording medium, a layer of microcapsules is carried on a side of a substrate sheet. The side of the substrate sheet is subject to adhesion-facilitating processing.

7 Claims, 3 Drawing Sheets

FIG. 3

| | R | R' | CHEMICAL STRUCTURE |
|---|---|---|---|
| SILANE COUPLING AGENT | $CH_2=CH-$ | $-(OCH_3)_3$ | $CH_2=CH-SI-(OCH_3)_3$ |
| | " | $-(OCH_2CH_2OCH_3)_3$ | $CH_2=CH-SI-(OCH_2CH_2OCH_3)_3$ |
| | $CH_2=C-CO-OCH_3-$<br>$\quad\mid$<br>$\quad CH_3$ | $-(OCH_3)_3$ | $CH_2=C-CO-OCH_3-SI-(OCH_3)_3$<br>$\quad\mid$<br>$\quad CH_3$ |
| | $CH_2-CH-CH_2-O(CH_2)_3-$<br>$\quad\diagdown O \diagup$ | " | $CH_2-CH-CH_2-O(CH_2)_3-SI-(OCH_3)_3$<br>$\quad\diagdown O \diagup$ |
| | $NH_2(CH_2)-$ | $-(OC_2H_5)_3$ | $NH_2(CH_2)-SI-(OC_2H_5)_3$ |
| | $NH_2(CH_2)_2NH(CH_2)_3-$ | $-(OCH_3)_3$ | $NH_2(CH_2)_2NH(CH_2)_3-SI-(OCH_3)_3$ |
| | $NH_2(CH_2)_2-$ | " | $NH_2(CH_2)_2-SI-(OCH_3)_3$ |
| | $Cl(CH_2)_3-$ | " | $Cl(CH_2)_3-SI-(OCH_3)_3$ |
| TITANIC COUPLING AGENT | $CH_3CH-$<br>$\quad\mid$<br>$\quad CH_3$ | $-(O(CH_2)nCH_3)_3$ | $CH_3CH-Ti-(O(CH_2)nCH_3)_3$<br>$\quad\mid$<br>$\quad CH_3$ |
| | $CH_3CH-$<br>$\quad\mid$<br>$\quad CH_3$ | $\left(\begin{array}{c}CH_3\\ \mid\\ OC(CH_2)_{14}CHCH_3\\ \parallel\\ O\\ OC-C=CH_2\\ \parallel\quad\mid\\ O\quad CH_3\end{array}\right)_2$ | $CH_3CH-Ti\left(\begin{array}{c}CH_3\\ \mid\\ OC(CH_2)_{14}CHCH_3\\ \parallel\\ O\\ OC-C=CH_2\\ \parallel\quad\mid\\ O\quad CH_3\end{array}\right)_2$ |
| | $\begin{array}{c}O\\ \diagup\quad\diagdown\\ O\quad C=O\\ \diagdown\quad\diagup\\ CH_2\end{array}$ | " | $\begin{array}{c}O-CH_2\\ \mid\quad\quad\diagdown\\ Ti\quad\quad C=O\\ \mid\quad\quad\diagup\\ O\quad\quad\end{array}$ |
| | | | $(iso\text{-}PrO)_4Ti$<br>$(n\text{-}BuO_4)Ti$<br>$(C_4H_9CH(C_2H_5)CH_2O)_4Ti$ |

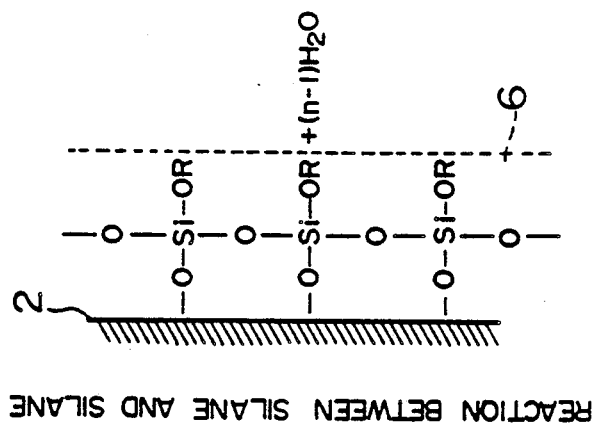
FIG. 4c REACTION BETWEEN SILANE AND SILANE
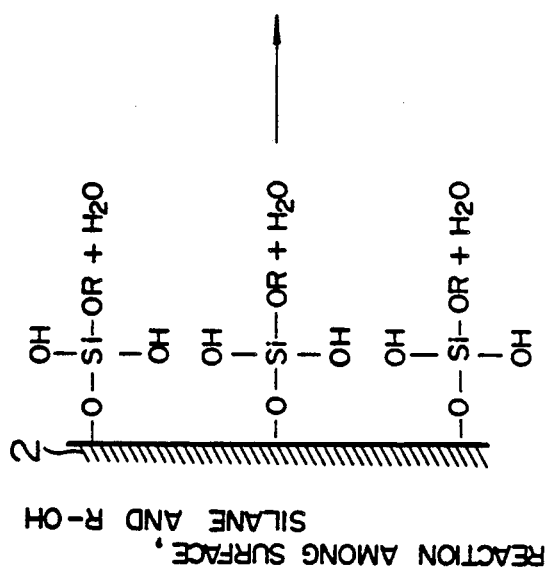
FIG. 4b REACTION AMONG SURFACE, SILANE AND R-OH
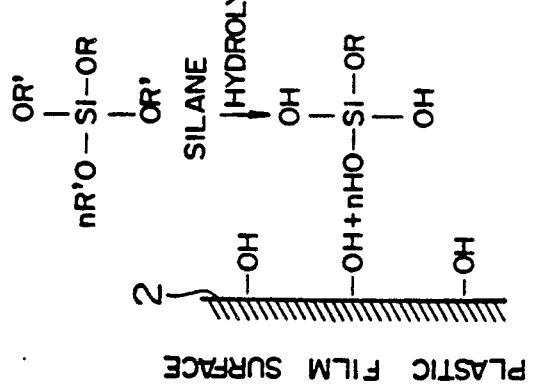
FIG. 4a PLASTIC FILM SURFACE

PHOTO AND PRESSURE SENSITIVE RECORDING MEDIUM

BACKGROUND OF THE INVENTION

This invention relates to a photo and pressure sensitive recording medium employing photo-sensitive microcapsules and, more particularly, to a recording medium on which an image can be recorded by means of light.

A photo and pressure sensitive recording medium is known from Japanese Patent Application Laid-Open Nos. 58-17432, 58-88739, 62-143044 and so on. In the known recording medium, microcapsules each primarily containing photo-curable resin, polymerization initiator and dye precursor are carried on a planar plastic sheet such as, for example, a polyethylene terephthalate film. In use of the recording medium, microcapsules carried on the plastic sheet are first exposed to light in accordance with optical information. Subsequently, the recording medium is superimposed upon a sheet (hereinafter referred to as "developer sheet") coated with developer material which can react with the dye precursor to develop color. Pressure is then applied to the superimposed recording medium and developer sheet to effect pressure fixing. By the pressure fixing, some of the microcapsules, which are not exposed to light, are destroyed so that the contents of the destroyed microcapsules react with the developer material on the developer sheet. Thus, an image is formed on the developer sheet.

In the conventional photo and pressure sensitive recording medium, however, there is such tendency that, when the microcapsules on the recording medium are exposed to light in accordance with optical information and, subsequently, the recording medium is superimposed upon the developer sheet to perform pressure fixing, not only do the contents of the microcapsules low in mechanical strength adhere to the developer sheet, but also a layer of the microcapsules adheres to the developer sheet. The above tendency is remarkable when the surrounding air is high in temperature and high in humidify at the pressure fixing. This is because adhesion strength of resinous binder coated on the plastic film together with the microcapsules is lowered as the temperature and humidify of the surrounding air rise. On the other hand, resinous binder, which is not lowered in adhesion strength even under high temperature and high humidity, is generally firm and strong. If such resinous binder is used in the recording medium, inconvenience occurs when the unexposed microcapsules are destroyed.

The developer sheet, to which the microcapsule layer adheres, is put out of order in its surface condition, that is, the surface of the developer sheet is roughened. Thus, a beautiful and fine image output cannot be obtained. Such image is low in commodity value.

SUMMARY OF THE INVENTION

It is therefore an object of this invention to provide an improved photo and pressure sensitive recording medium capable of preventing a layer of microcapsules from adhering to a developer sheet at pressure fixing even under high temperature and high humidity.

For the above purpose, according to the invention, there is provided a photo and pressure sensitive recording medium comprising a substrate sheet, and a layer of microcapsules carried on a side of the substrate sheet, wherein the side of the substrate sheet is subject to adhesion-facilitating processing.

Since the substrate sheet of the recording medium according to the invention is subject to the adhesion-facilitating processing, the layer of microcapsules can effectively be prevented from adhering to a developer sheet at pressure fixing even under high temperature and high humidity. Thus, it is possible to obtain a beautiful and fine image output.

BRIEF DESCRIPTION OF THE ACCOMPANYING DRAWINGS

FIG. 3 is a table showing various types of coupling agents; and

FIGS. 4a through 4c are views for explanantion of a chemical action of a coupling agent in case of the use of silane coupling agent.

DESCRIPTION OF THE EMBODIMENTS

Figure 1:
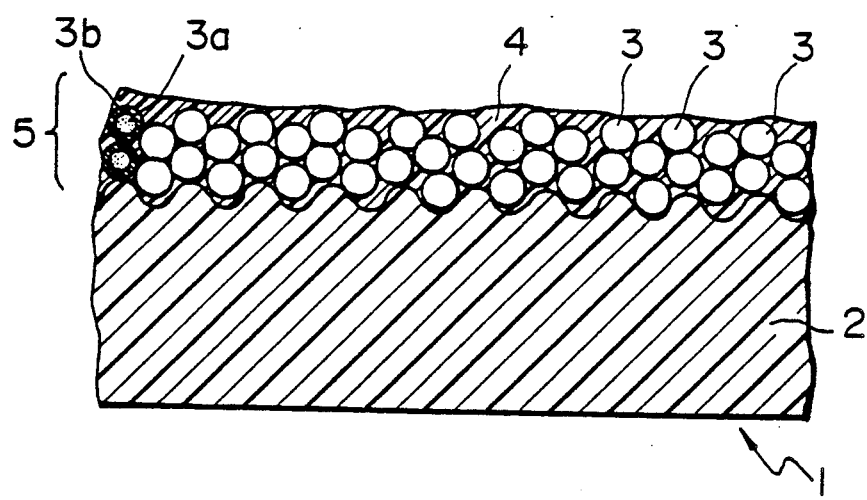
FIG. 1 is an exaggerated fragmentary cross-sectional view of a photo and pressure sensitive recording medium embodying the invention, showing adhesion-facilitating processing by which irregularities are formed on a side of a film.

Referring to FIG. 1, there is exaggeratedly shown in cross-section a photo and pressure sensitive recording medium 1 embodying the invention. The recording medium comprises a film 2 serving as a substrate sheet. The film 2 is subject to sandblasting using particles on the order of 10 to 30 micrometers in diameter, so that the film 2 has its one side formed with fine or minute irregularities. A layer 5 of mixture of photo curable microcapsules 3 and resinous binder 4 carried on the side of the film 2 which is subject to the sandblasting. Plastic films, gelatin films or the like can be used as the film 2. The plastic films include a polyvinyl chloride film, a polyvinylidene chloride film, a polyethylene film, a polypropylene film, a polyethylene terephthalate film, and so on.

The microcapsules 3 each contain dye precursor, photo-curable resin, polymerization initiator and the like. Employed as the dye recursor is a compound which has, in its partial skeleton, a lactone, lactam, sulton, spiropiran, ester or amide structure. For instance, an element or a combination of a triaryl methane compound, a bisphyenyl methane compound, a xanthene compound, a fluoran compound, a thiazine compound, a spiropiran compound and similar compounds is used as the dye precursor. On the other hand, used as the photo-curable resin is ethylene unsaturated acid ester of polyhydric alcohol such as ethylene glycol dimethacrylate, triethylene glycol dimethacrylate, trimethylolpropane triacrylate (TMPTA), trimethylolpropane trimethacrylate, penetaerythritol triacrylate, penetaerythritol trimethacrylate or the like. Further, employed as the polymerization initiator is diallyl ketone derivative such as benzophenone, Michler's ketone, benzoyl methyl ether, isopropyl xanthone, isopropyl thioxanthone or the like. Benzoyl alkyl ether, ketocoumarin compound or the like is also used as the polymerization initiator. Each of the microcapsules 3 is manufactured in such a form that the contents 3a such as the dye precursor, the photo-curable resin, the polymerization initiator and so on described previously are accommodated in a wall membrane 3b by means of the known technique such as a coacervation process, an interface-polymerization proces or the like. The wall membrane 3b is formed of, for example, urea-formaldehyde polymer, melamine-formaldehyde polymer, methylol melamine-formaldehyde polymer or the like. The microcapsules 3 are mixed with the resinous binder 4 having added thereto filler, viscosity control agent and so on. The mixture of the microcapsules 3 and the resinous binder 4 is coated on the sandblasted film 2 by an applicator roller, a spray, a doctor knife, a bar coater or the like. Thus, the photo and pressure sensitive recording medium 1 is formed. In this connection, polyvinyl alcohol, acrylic binder, vinyl acetic binder or the like may be used as the resinous binder 4.

As described above, the arrangement of the photo and pressure sensitive recording medium 1 is such that the microcapsules 3 are carried on the sandblasted film 2 by the resinous binder 4. With the arrangement, the adhesion area increases, and the resinous binder 4 containing the microcapsules 3 is bitten into recesses in the film 2 formed with irregularities by the sandblasting. Accordingly, the adhesion strength of the microcapsules 3 to the film 2 is higher than that of the conventional photo and pressure sensitive recording medium in which microcapsules are carried, by the use of the same resinous binder, on a film which is not subject to adhesion-facilitating processing. Thus, even if the pressure fixing is carried out after exposure of the recording medium embodying the invention, to light, it is possible to effectively prevent the layer 5 of the microcapsules 3 and the resinous binder 4 from adhering to a developer sheet.

The above embodiment has been described as comprising the film 2 which is subject to the sandblasting. It is to be understood, however, that similar result is obtained also by a film having one side thereof formed with fine or minute irregularities by means of embossing, corona treatment, plasma treatment, or ozonizing treatment.

Various examples will next be described, in which the above-mentioned adhesion-facilitating processing is carried out by means of chemical treatment.

In case of the chemical treatment, metallic foil or the like can be utilized as the film 2, in addition to a plastic film such as a polyvinyl chloride film, a polyvinylidene chloride film, a polyethylene film, a polypropylene film, a polyester film, a polycarbonate film, a polyimide film, a fluoric film or the like.

The film 2 was treated chemically in the following manner, as the adhesion-facilitating processing.

EXAMPLE NO. 1

Flame from a gas burner was jetted toward a film 2 to directly heat one side thereof. Subsequently, the side of the film 2 was wiped quickly with solvent. This treatment was particularly effective for the polyethylene film.

EXMPLE NO. 2

A film 2 was dipped, for ten (10) minutes, in mixture solution of 75 parts of potassium dichromate, 1500 parts of sulfuric acid and 120 parts of water. The temperature of the mixture solution was 60° C. Subsequently, the film 2 was rinsed with water sufficiently. This treatment was particularly effective for the polyethylene film.

EXAMPLE NO. 3

A film 2 was dipped, for ninety (90) seconds, in mixture solution of 5 parts of sodium dichromate, 100 parts of sulfuric acid and 8 parts of water. The temperature of the mixture solution was 60° C. Subsequently, the film 2 was rinsed with hot water sufficiently. The film 2 was then dried at the room temperature. This treatment was particularly effective for the polypropylene film.

EXAMPLE NO. 4

A film 2 was dipped in solution of 20 parts of caustic soda and 80 parts of water for ten (10) minutes. The temperataure of the solution was 80° C. The film 2 was then rinsed with hot water and, subsequently, was dried with hot air. This treatment was particularly effective for the polyester film.

EXAMPLE NO. 5

A film 2 was dipped in solution of 5 parts of caustic soda and 95 parts of water for one (1) minute. The temperature of the solution was 75° C. The film 2 was then rinsed with cold water sufficiently. Subsequently, the film 2 was dried with hot air. This treatment was particularly effective for the polymide film.

EXAMPLE NO. 6

A film was dipped, for one (1) hour, in solution in which 30 parts of sodium was dispersed in 100 parts of 28% ammonia water. This treatment was effective for the fluoric plastic film.

EXAMPLE 7

A film 2 was dipped in concentrated sulfuric acid for two (2) seconds. The temperature of the sulfuric acid was 100° C. This treatment was effective for a polystyrene film.

EXAMPLE NO. 8

A film 2 was dipped in solution of 53 parts of chromic acid anhydride and 1000 parts of water for three (3) minutes. The temperature of the solution was 65° C. Subsequently, the film 2 was rinsed with water. The film 2 was then dried at the room temperature. This treatment was effective for the metallic foil, particularly, stainless steel foil.

EXAMPLE NO. 9

A film 2 was dipped, for twenty (20) minutes, in mixture solution of 118 parts of sodium dichromate, 412 parts of sulfurcic acid and 1000 parts of water. The temperature of the mixture solution was 60° C. Subsequently, the film was rinsed with hot water sufficiently. The film 2 was then dried at the room temperature. This treatment was particularly effective for aluminum foil and aluminum-alloy foil.

EXAMPLE NO. 10

A film 2 was dipped in mixture solution of 59 parts of potassium dichromate, 118 parts of sulfuric acid and 1000 parts of water, for three (3) minutes and at the room temperature. The film 2 was then rinsed with water and, subsequently, was dried at the room temperature. This treatment was particularly effective for copper foil, brass foil, and copper-alloy or brass-alloy foil.

EXAMPLE NO. 11

A film 2 was dipped in solvent of trichloroethylene, pentachloroethane, chloric one such as dichloropentane or the like, toluene, xylene, ethyl acetate, methyl acetate, methyl ethyl ketone or the like.

By one of the chemical treatments referred to above, the side of the film 2 is corroded so that fine irregularities are formed on the side of the film 2. The surface irregulatities are on the order of 2 through 10 micrometers, and are finer than those formed by the aforementioned sandblasting. Accordingly, pressure can be applied uniformly to each microcapsule, in pressure fixing in which the photo and pressure sensitive recording medium comprising the thus formed film 2 is superimposed upon a developer sheet having its side coated with developer material, which reacts with the dye precusor to develop color, and pressure is applied to the superimposed recording medium and developer sheet. Thus, there is provided also such an advantage that the developer sheet can be developed efficiently.

Figure 2:
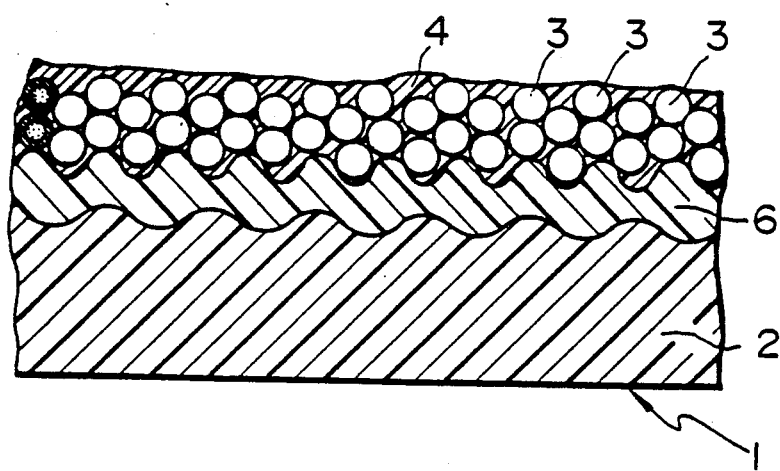
FIG. 2 is a view similar to FIG. 1, but showing a modified recording medium in which an intermediate layer is formed on a side of a film as adhesion-facilitatiang processing.

FIG. 2 shows a modified photo and pressure sensitive recording medium. In FIG. 2, components and parts like or similar to those illustrated in FIG. 1 are designated by the same or like reference numerals, and the detailed description of the like or similar components and parts will therefore be omitted to avoid repetition.

In the modified recording medium shown in FIG. 2, an intermediate layer 6 serving as primer is carried on a side of a plastic film 2 which is subject to any one of the adhesion-facilitating processings described previously. By the intermediate layer 6, the effect of the adhesion-facilitating processing can further be enhanced. As material of the intermediate layer 6 serving as primer, acrylic material, melamine material, silicon-containing material or the like can be utilized.

An example of the intermediate layer 6 serving as primer using acrylic material will first be described. Dimethacrylate of diethylene or triethylene glycol, or dimethacrylate of alkane diol having the carbon number of three through six, or monomer consisting of mixture of these dimethacrylates is coated on one side of a film 2, and drying and polymerization are carried out simultaneously.

In addition to the above example, there is also the following method of forming the intermediate layer 6. That is, coating liquid is prepared in which 20 parts of dipentaerythritol pentaacrylate, 10 parts of tetrahydro furfuryl acrylate and 2 parts of benzoin ethyl ether are solved in solvent of 60 parts of isopropyl alcohol and 10 parts of toluene. The coating liquid is coated on a side of a plastic film 2. Subsequently, the film 2 is dried with air for ten (10) minutes. The film 2 is then illuminated for fifteen (15) seconds by a high-pressure mercury-vapor lamp which is arranged within air at a position spaced 20 cm away from the film 2, thereby curing the coated liquid. Thus, the intermediate layer 6 serving as primer is formed.

An example of the intermediate layer 6 formed of melamine material will next be described. A small quantity of 85% phosphoric acid is added to mixture of methoxymethyl melamine and 1,4-butanediol. Mixture of the 85% phosphoric acid and the mixture of methoxymethyl melamine and 1,4-butanediol is heated to 150° C. to react them with each other. Ethyl cellosolve is added to the thus formed mixture to form polyol condensation melamine resin solution (hereinafter referred to as "A-liquid"). On the other hand, benzoyl peroxide is added to mixture of 2-hydroxyethyl acrylate, methyl methacrylate and ethyl cellosolve. They are polymerized with each other for six (6) hours and at 130° C., to form vinyl copolymer solution containing hydroxyl groups (hereinafter referred to as "B-liquid"). The A-liquid and the B-liquid are solved in ethyl cellosolve to form solution having added thereto para-toluenesulfonic acid. The solution having added thereto para-toluenesulfonic acid is coated on a side of a film 2, and is heated by hot air for three (3) hours, to form an intermediate layer 6 that is the object.

Furthermore, a method of forming organopolysiloxane from organosiloxane can be considered as an example of the intermediate layer 6 formed of silicon-containing material.

The binder 4 mixed with the microcapsules 3 is coated, in a manner like that described previously with reference to FIG. 1, on the intermediate layer 6 serving as primer which is formed in the manner described above. Generally, the intermediate layer 6 serving as primer and the layer 5 of the binder 4 adhere firmly to each other, and are difficult to be separated or stripped from each other. In the modification illustrated in FIG. 2, the intermediate layer 6 serving as primer is formed on the film 2 which has been subjected to the adhesion-facilitating processing. However, an effect to a certain degree can be expected even if the intermediate layer 6 is formed on a side of a usual or ordinary film.

Further, an intermediate layer may be formed by surface treatment using coupling agent, instead of the intermediate layer 6 serving as primer illustrated in FIG. 2. In this case, it is possible to expect an effect similar to that described above.

As coupling agent, there are various materials as shown in FIG. 3. A suitable one of these materials is selected depending upon the material of the film 2 and the material of the binder 4. A chemical action of the coupling agent is illustrated in FIGS. 4a through 4c as an example of silane coupling agent. In this example, as shown in FIG. 4a, dehydro condensation reaction occurs between —OH formed by hydrolysis of —OR' within molecules of the silane coupling agent and functional groups like —OH existing on the surface of the film 2, so that reaction product is formed on the surface of the film 2 as shown in FIG. 4b. Further, the silane coupling agent and the silane coupling agent react with each other so that a strong layer of the silane coupling agent is formed on the surface of the film 2, as shown in FIG. 4c. As a result, as will be seen from FIG. 4c, the outside of the surface of the film 2 is coated with the functional groups of —OR within the molecules of the silane coupling agent. The functional groups of —OR are coupled to the binder layer 4, thereby enhancing the easy adhesion property or characteristic.

In order to carry out the surface treatment by the silane coupling agent in the manner described above, it is required that the functional groups such as —OH, —COOH, —CONH$_2$, —NH$_2$ or the like (—OH in the example illustrated in FIGS. 4a through 4c), which is capable of reacting with the silane coupling agent, exist on the surface of the film 2. In case where no functional groups exist on the surface of the film 2, for example, in case where polyolefin or fluoric plastic utilized as the film 2, treatment should be carried out by the silane coupling agent, with functional groups formed beforehand on the surface of the film 2 by means of medicine treatment, plasma treatment or the like. Moreover, there may be a case where it is preferable that, even if a film has functional groups, the functional groups are activated in a manner similar to that described above. The treatment due to the silane coupling agent is to improve wetting property with respect to the binder 4 by the treatment of the surface of the film 2. If the silane coupling agent is selected in such a manner that the solubility parameter of —OR of the functional groups within the molecules of the silane coupling agent is approximate to a value of the solubility parameter of the solvent used in the binder 4, it is possible to form a surface easy to wet by the blinder 4. Furthermore, —OR having such property as to be capable of reacting with the macromolecular component within the binder 4 improves close contact between the silane coupling agent and the binder 4, that is, between the film 2 and the binder 4 due to reaction between the macromolecule and —OR.

Substantially the same can be said to coupling agents shown in FIG. 3, other than the silane coupling agent.

Further, although not shown in FIG. 3, the surface of the film 2 may be treated by chromic coupling agent, organic phosphoric chlorine coupling agent, silver oxide coupling agent or the like.

Furthermore, an intermediate layer may be formed by grafting. In this connection, in case of polyvinyl chloride, acrylamide is used and is grafted for one (1) hour by an intermediate-pressure mercury-vapor lamp of 200 W, to form the intermediate layer. Subsequently, the binder 4 mixed with the microcapsules 3 is carried on the intermediate layer.

What is claimed is:

1. In a photo and pressure sensitive recording medium of the type comprising:

a microcapsule sheet including a plastic substrate sheet and a layer formed of a mixture of a plurality of photo-curable microcapsules and resinous binder, said layer being carried on a side of said substrate sheet, said microcapsules each containing a dye precursor, photo-curable resin, and polymerization initiator, wherein when said microcapsule sheet is exposed to ling in accordance with an image to be developed, said microcapsules coated on an area corresponding to said image are cured, and a developing sheet, said developing sheet being coated with a developer material which is reactable with said dye precursor, said developing sheet being arranged to be superimposed over and pressurized with said microcapsule sheet so that a visible image corresponding to said image is formed on said developing sheet by means of a reaction between said developer material and said dye precursor streamed out of the uncured microcapsules;

the improvement wherein said substrate sheet has fine irregularities formed therein by adhesion-facilitating processing on said side on which said layer is formed whereby a high adhesion strength of said microcapsules to said substrate sheet is formed so that cured microcapsules are prevented from adhering to said developing sheet when said microcapsules sheet and said developing sheet are superimposed against and pressurized with each other.

2. The photo and pressure sensitive recording medium according to claim 1, wherein said substrate sheet is sandblasted as said adhesion-facilitating processing.

3. The phot and pressure sensitive recording medium according to claim 1, wherein said substrate sheet is embossed as said adhesion-facilitating processing.

4. The photo and pressure sensitive recording medium according to claim 1, wherein said substrate sheet is subject to one of corona treatment, plasma treatment and ozonizing treatment, as said adhesion-facilitating processing.

5. The photo and pressure sensitive recording medium according to claim 1, wherein said side of said substrate sheet is corroded chemically as said adhesion-facilitating processing.

6. The photo and pressure sensitive recording medium according to claim 5, wherein said substrate sheet is corroded by one of acid solution and alkaline solution.

7. The photo and pressure sensitive recording medium according to claim 5, wherein said substrate sheet is corroded by organic solvent.

* * * * *